(12) United States Patent
Zhang et al.

(10) Patent No.: US 10,242,732 B2
(45) Date of Patent: Mar. 26, 2019

(54) MEMORY ELEMENTS WITH SOFT-ERROR-UPSET (SEU) IMMUNITY USING PARASITIC COMPONENTS

(71) Applicant: Intel Corporation, Santa Clara, CA (US)

(72) Inventors: Weimin Zhang, San Jose, CA (US); Nelson Joseph Gaspard, San Jose, CA (US); Yanzhong Xu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/595,228

(22) Filed: May 15, 2017

(65) Prior Publication Data

US 2018/0330778 A1    Nov. 15, 2018

(51) Int. Cl.
| | | |
|---|---|---|
| *G11C 11/412* | (2006.01) | |
| *G11C 5/00* | (2006.01) | |
| *G11C 7/10* | (2006.01) | |
| *G11C 5/06* | (2006.01) | |
| *H01L 27/11* | (2006.01) | |

(52) U.S. Cl.
CPC .......... *G11C 11/4125* (2013.01); *G11C 5/005* (2013.01); *G11C 7/1072* (2013.01); *G11C 5/06* (2013.01); *H01L 27/11* (2013.01)

(58) Field of Classification Search
CPC ... G11C 11/4125; G11C 5/005; G11C 7/1072; G11C 5/06; H01L 27/11
USPC .................................................... 365/233.14
See application file for complete search history.

(56) References Cited

U.S. PATENT DOCUMENTS

| | | | |
|---|---|---|---|
| 4,852,060 A | 7/1989 | Rockett, Jr. | |
| 5,126,279 A | 6/1992 | Roberts | |
| 5,307,142 A | 4/1994 | Corbett et al. | |
| 5,331,164 A | 7/1994 | Buehler et al. | |
| 5,504,703 A | 4/1996 | Bansal | |
| 5,631,863 A | 5/1997 | Fechner et al. | |
| 6,275,080 B1 | 8/2001 | Phan et al. | |
| 6,975,041 B2 * | 12/2005 | Hirano | G11C 11/4125 257/393 |
| 7,092,309 B2 | 8/2006 | Liaw | |
| 7,193,887 B2 | 3/2007 | Wood | |

(Continued)

OTHER PUBLICATIONS

Calin et al., "Upset Hardened Memory Design for Submicron CMOS Technology", IEEE Transactions on Nuclear Science, vol. 43, No. 6, Dec. 1996.

(Continued)

*Primary Examiner* — Fernando Hidalgo
(74) *Attorney, Agent, or Firm* — Treyz Law Group, P.C.; Jason Tsai

(57) ABSTRACT

An integrated circuit is provided that includes memory elements that exhibit immunity to soft error upset (SEU) events when subjected to high-energy atomic particle strikes. Each memory element may include at least two inverting circuits coupled in a feedback loop. Transistors in the memory element may be grouped in one contiguous region or divided into multiple separate regions. The memory element may include a long gate conductor that extends outside the boundary of the one contiguous region or the multiple separated regions. The long gate conductor may serve to provide parasitic resistance in the feedback loop to help mitigate SEU disturbances.

20 Claims, 8 Drawing Sheets

(56) References Cited

U.S. PATENT DOCUMENTS

| | | | |
|---|---|---|---|
| 7,233,518 B2 | 6/2007 | Liu | |
| 7,352,610 B1 | 4/2008 | Pedersen et al. | |
| 7,366,006 B2* | 4/2008 | Zhang | G11C 11/4125 365/154 |
| 7,872,903 B2 | 1/2011 | Pedersen | |
| 7,920,410 B1 | 4/2011 | Lee et al. | |
| 8,218,353 B1 | 7/2012 | Liu et al. | |
| 8,289,755 B1* | 10/2012 | Rahim | G11C 11/4125 365/154 |
| 8,355,292 B2 | 1/2013 | Xu et al. | |
| 8,797,790 B1 | 8/2014 | Rahim et al. | |
| 9,276,083 B2 | 3/2016 | Sinha et al. | |
| 9,344,067 B1 | 5/2016 | Wu et al. | |
| 2002/0130348 A1 | 9/2002 | Tran | |
| 2005/0259462 A1 | 11/2005 | Wood | |
| 2006/0262612 A1 | 11/2006 | Lovett | |
| 2007/0041242 A1 | 2/2007 | Okazaki et al. | |
| 2008/0087927 A1 | 4/2008 | Shin et al. | |
| 2013/0107608 A1* | 5/2013 | Mann | H01L 27/1108 365/154 |
| 2016/0111168 A1* | 4/2016 | Cline | G11C 17/18 365/96 |
| 2018/0158513 A1* | 6/2018 | Tanaka | G11C 7/1075 |

OTHER PUBLICATIONS

Rahim et al. U.S. Appl. No. 61/113,573, filed Nov. 11, 2008.
Xu et al. U.S. Appl. No. 61/113,576, filed Nov. 11, 2008.
Rahim et al. U.S. Appl. No. 61/120,334, filed Dec. 5, 2008.

\* cited by examiner

MEMORY ELEMENTS WITH SOFT-ERROR-UPSET (SEU) IMMUNITY USING PARASITIC COMPONENTS

BACKGROUND

This relates to integrated circuits and more particularly, to integrated circuits with memory elements.

Integrated circuits often contain volatile memory elements. Typical volatile memory elements are based on cross-coupled inverters (latches). A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of an integrated circuit.

As a result, volatile memory elements such as static random-access memory (SRAM) cells are often used. Volatile memory elements are also used in programmable logic device integrated circuits.

Volatile memory elements are subject to a phenomenon known as soft error upset ("SEU"). Soft error upset events are caused by cosmic rays and radioactive impurities, which generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the date stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications.

It is within this context that the embodiments described herein arise.

DETAILED DESCRIPTION

Integrated circuits often include arrays of volatile memory elements. These memory element arrays can be used to store data during data processing operations. In programmable integrated circuits such as programmable logic devices, arrays of memory elements may be loaded with configuration data that is used in configuring programmable logic circuitry. Memory cells that are used in storing configuration data for programmable integrated circuits are sometimes referred to as configuration random-access memory (CRAM) cells. Memory cells used in other types of random-access memory (RAM) arrays are sometimes referred to as RAM cells.

Memory arrays formed from CRAM cells and other RAM cells can be disrupted by radiation strikes. Disruptions of this type are known as soft error upset ("SEU") events. Soft error upset events are caused when high-energy atomic particles such as neutrons and alpha particles strike a portion of a memory element. Electron-hole pairs are generated when an atomic particle strikes the silicon that makes up a memory element. The electron-hole pairs can disrupt the charges on various nodes in the memory element and thereby cause the memory element to change states (e.g., to flip from a one to a zero or vice versa).

To reduce or eliminate soft error upset events and thereby improve integrated circuit reliability, memory elements can be formed that uses long gate routing conductors to serve as a SEU mitigation resistor. The SEU mitigation resistance, in combination with parasitic capacitances of transistors within the memory elements, can provide resistance-capacitance (RC) delay between storage nodes within a memory cell, which helps to filter out any SEU disturbances without any area penalty.

Such types of memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention may sometimes be described in the context of programmable logic device integrated circuits. This is, however, merely illustrative. Memory cells in accordance with embodiments of the present invention may be used in any suitable circuits.

Figure 1:
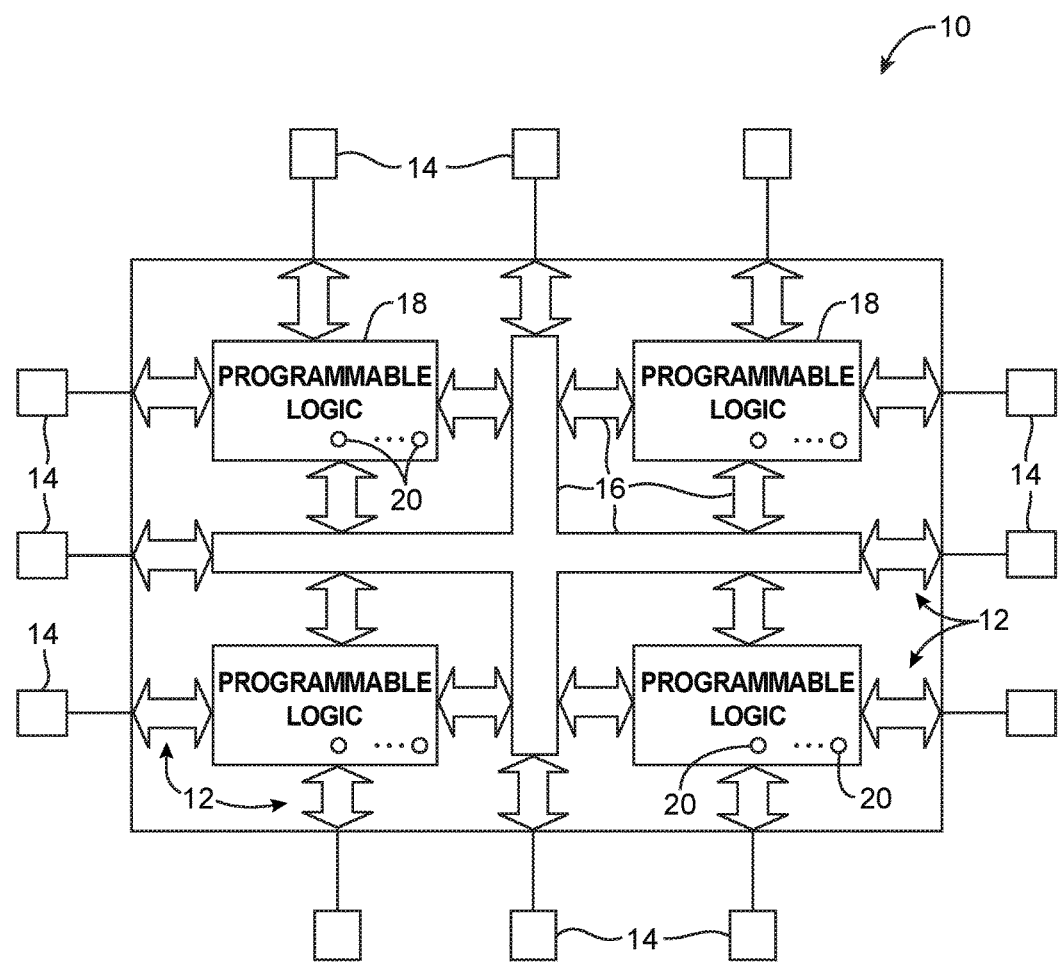
FIG. 1 is a diagram of an illustrative integrated circuit that may contain random-access memory (RAM) cells in accordance with an embodiment.

An illustrative integrated circuit 10 such as a programmable logic device or other programmable integrated circuit with memory is shown in FIG. 1. Device 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input-output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input-output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
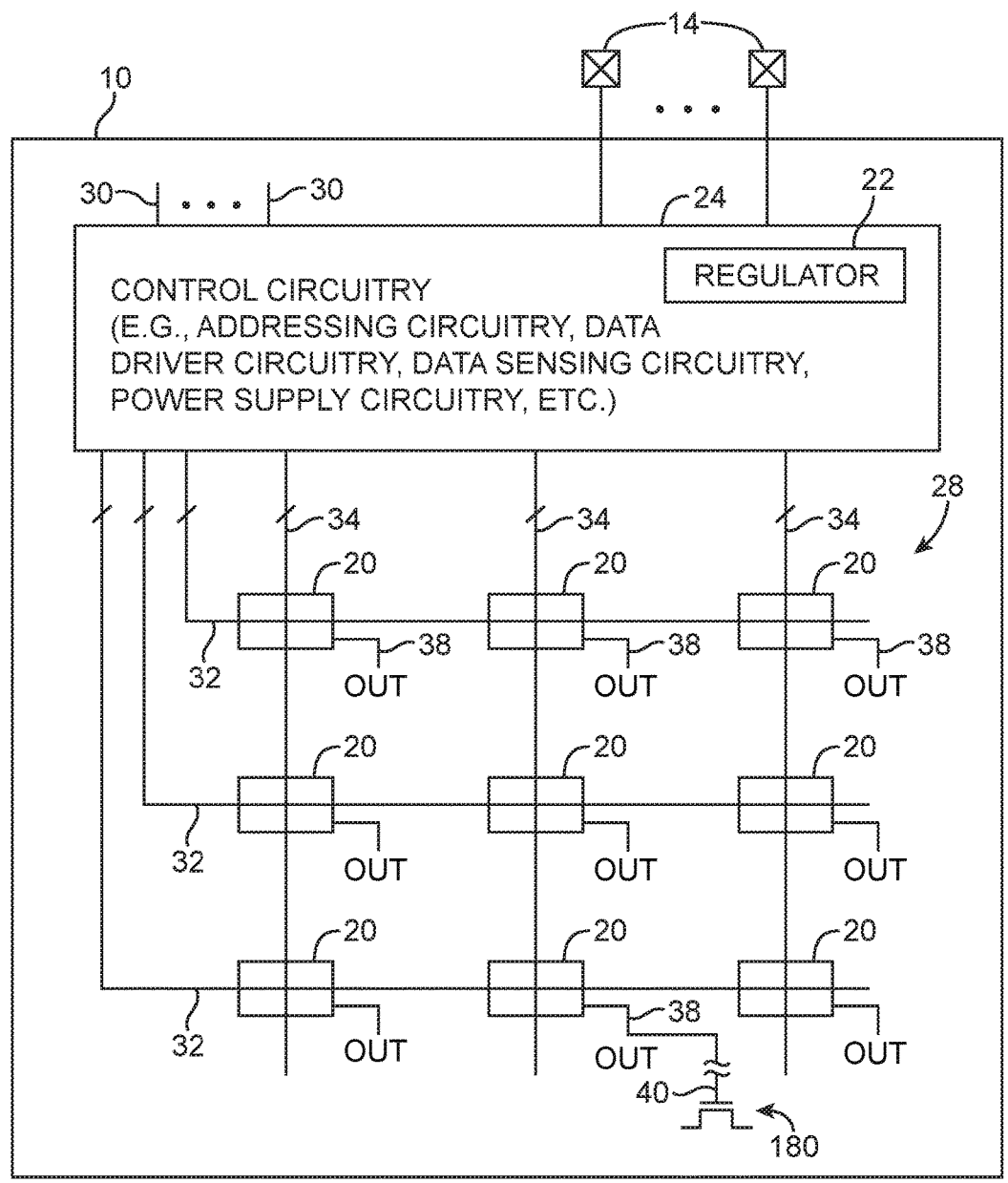
FIG. 2 is a diagram of an illustrative array of memory cells in accordance with an embodiment.

Any suitable memory array architecture may be used for memory elements 20. One suitable arrangement is shown in FIG. 2. As shown in FIG. 2, there may be an array 28 of memory elements 20 in device 10. There are only three rows and columns of elements 20 in the illustrative array of FIG. 2, but in general there may be hundreds or thousands of rows and columns in array 28. Array 28 may be one of a number of arrays on a given device 10, may be a subarray that is part of a larger array, or may be any other suitable group of memory elements 20. Each memory element may supply a corresponding output signal OUT at a corresponding output path 38. In CRAM arrays, each signal OUT is a static output control signal that may be conveyed over a path 40 and used in configuring a corresponding transistor such as transistor 180 (e.g., a pass transistor that is sometimes part of a routing multiplexer) or other circuit element in associated programmable logic 18.

Integrated circuit 10 may have control circuitry 24 for supplying signals to memory elements 20 in memory array 28. Control circuitry 24 may receive power supply voltages, data, and other signals from external sources using pins 14 and from internal sources using paths such as paths 30. Control circuitry 24 may include circuitry such as an adjustable voltage supply (regulator 22), address decoder circuitry, address register circuitry, data driver circuitry, data sensing circuitry, power supply circuity, etc. Regulator 22 may be used to produce time-varying power supply voltages. These power supply voltages may be of the same magnitude as the voltages received on pins 14 or may have different magnitudes than the voltage received from pins 14. Control circuitry 24 can use the power supply voltages supplied by pins 14 and by regulator 22 to produce desired time-varying and fixed signals on paths such as paths 32 and 34.

There may, in general, be any suitable number of conductive lines associated with paths 32 and 34. For example, each row of array 28 may have a single associated address line in a respective one of paths 32 that carries a corresponding address or word line signal (as an example). Each column of array 28 may have a respective path 34 in which a corresponding data line is used to receive a data signal. Power can be distributed in a global fashion. For example, a positive power supply voltage (sometimes referred to as Vcc) may be supplied in parallel to each cell 20 using a pattern of shared horizontal or vertical conductors. A ground voltage Vss may likewise be supplied in parallel to the cells 20 using a pattern of shared horizontal or vertical lines. Address lines and data lines are typically orthogonal to each other (i.e., address lines are horizontal while data lines are vertical or vice versa).

If desired, other patterns of lines may be used in paths 32 and 34. For example, both true and complement data signals can be routed into array 28 using parallel sets of lines. Similarly, different numbers of power supply signals, data signals, and address signals may be used.

The signals that are supplied to memory elements 20 may sometimes be collectively referred to as control signals. In particular contexts, some of these signals may be referred to as power signals, clear signals, data signals, address signals, etc. These different signal types are not mutually exclusive.

Any suitable values may be used for positive power supply voltage Vcc and ground voltage Vss. For example, positive power supply voltage Vcc may be 1.2 volts, 1.1 volts, 1.0 volts, 0.9 volts, or any other suitable voltage. Ground voltage Vss may be, for example, 0 volts. In a typical arrangement, power supply voltages Vcc may be 1.0 volts, Vss may be 0 volts, and the signal levels for address, data, and clear signals may range from 0 volts (when low) to 1.0 volts (when high).

Figure 3:
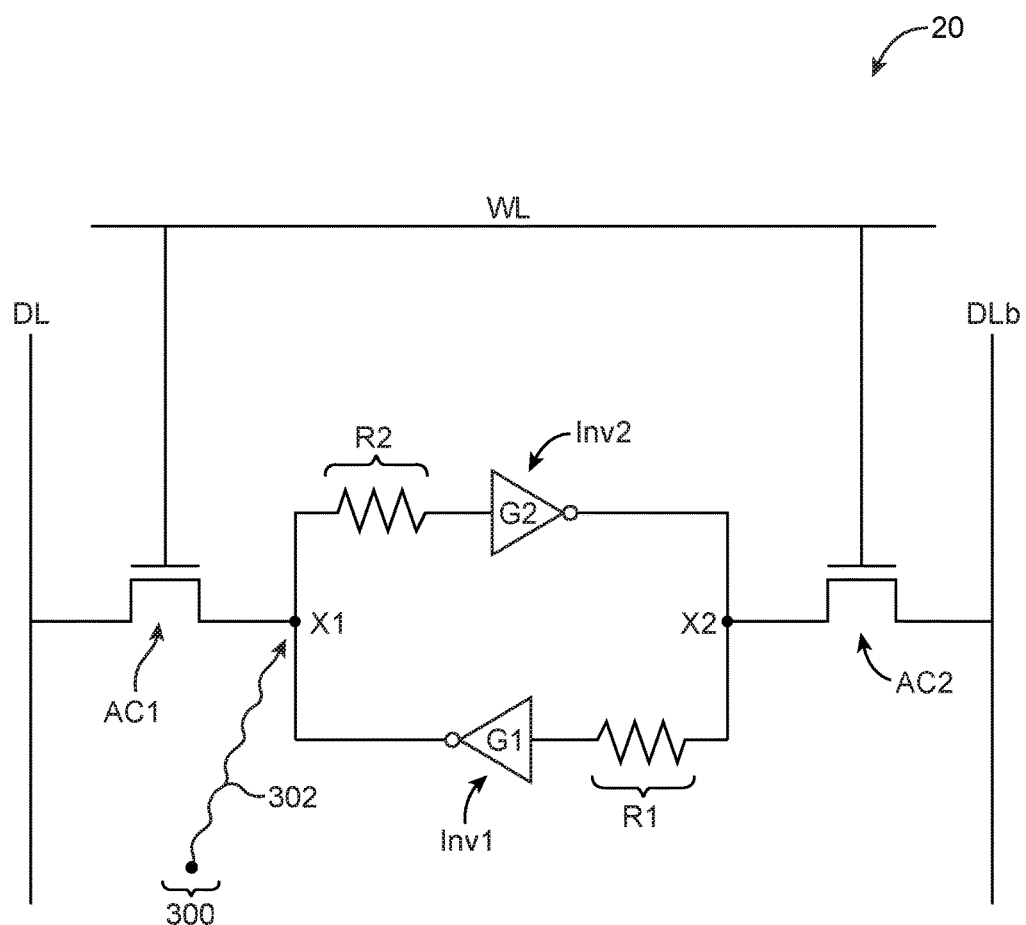
FIG. 3 is a diagram of an illustrative memory cell in accordance with an embodiment.

A memory element 20 of the type that may be used in array 28 of FIG. 2 is shown in FIG. 3. As shown in FIG. 3, memory element 20 may include cross-coupled inverting circuits such as inverting circuits Inv1 and Inv2 each of which has an input and an output. Inverting circuits Inv1 and Inv2 may each include at least one or more pull-down transistors and one or more pull-up transistors. The input of circuit Inv1 may be coupled to the output of circuit Inv2, and the input of circuit Inv2 may be coupled to the output of circuit Inv1.

The output of circuit Inv1 may serve as a first internal data storage node X1 for cell 20, whereas the output of circuit Inv2 may serve as a second internal data storage node X2 for cell 20. The storage portion of cell 20 configured in this way may be used to store a single bit of data (e.g., data storage nodes X1 and X2 may store true and complement versions of a single data bit, respectively). As an example, cell 20 that is storing a high data bit may have data storage nodes X1 and X2 respectively driven to "1" and "0." As another example, cell 20 that is storing a low data bit may have data storage nodes X1 and X2 respectively driven to "0" and "1."

The storage portion of memory cell 20 may be coupled to access transistors (sometimes referred to as memory address transistors) such as transistors AC1 and AC2 for performing read and/or write operations. In the example of FIG. 3, access transistor AC1 may be coupled between a first data line (e.g., a true data line on which true data signal DL is conveyed) and first data storage node X1, whereas access transistor AC2 may be coupled between a second data line (e.g., a complementary data line on which complement data signal DLb is conveyed) and second data storage node X2. Transistors AC1 and AC2 may each have a gate terminal that is coupled to an address line on which word line signal WL is conveyed.

During normal operation, the true and complementary data lines may be nominally driven to zero volts to minimize leakage currents, whereas address signal WL may be deasserted (e.g., word line signal WL may be pulled low to disable access transistors AC1 and AC2).

During write operations, desired data signals may be presented on the first and second data lines. Word line signal WL may then be asserted to enable access transistors AC1 and AC2 to write in a desired value into memory cell 20. As an example, data line signals DL and DLb may be respectively driven to logic "1" and "0" to load a high data bit into memory cell 20 using the activated access transistors AC1 and AC2. As another example, data line signals DL and DLb may be respectively driven to logic "0" and "1" to load a low data bit into memory cell 20 using the activated access transistors AC1 and AC2.

During read operations, the first and second data lines may be precharged to a high voltage level. Word line signal WL may then be asserted to enable access transistors AC1 and AC2 to read out a currently stored value in memory cell 20. If cell 20 is storing a logic "1" (i.e., node X1 is storing a "1"), the first data line will remain charged at the high voltage level while the second data line will discharge towards zero volts through transistor AC2. If cell 20 is storing a "0" (i.e., if node X1 is storing a "0"), the first data line will discharge towards zero volts through transistor AC1 while the second data line will remained charged at the high voltage level. Other read circuitry such as sense amplifier circuitry (not shown) may be used to sense the voltage difference between the first and second data lines and may be used to determine whether cell 20 is currently storing a "1" or "0" based on the polarity of the voltage difference (e.g., by determining which one of the first and second data lines has discharged towards ground).

Consider an example in which cell 20 shown in FIG. 3 is currently storing a logic "0" (i.e., internal data storage node X1 is currently low). An alpha particle such as particle 300 striking node X1 (as indicated by arrow 302) can potentially cause the voltage at node X1 to be perturbed. If the voltage at node X1 inadvertently rises above a switching threshold of circuit Inv2, then cell 30 will undesirably flip to a new erroneous state (i.e., circuit Inv2 will drive node X2 low, which will then cause circuit Inv1 to drive node X1 high). This type of disruption is sometimes referred to as a soft error upset ("SEU") event.

In accordance with an embodiment, resistances such as resistances R1 and R2 may be interposed within the memory cell feedback loop to help mitigate SEU disturbances. In the example of FIG. 3, resistance R1 may be coupled at the input of circuit Inv1 (e.g., at gate terminal G1 of inverter Inv1), whereas resistance R2 may be coupled at the input of circuit Inv2 (e.g., at gate terminal G2 of inverter Inv2). Resistances R1 and R2, along with parasitic transistors capacitances at terminals G1 and G2, collectively present additional resistance-capacitance (RC) delay between the storage nodes and the gate terminals. Introducing additional RC delay between node X2 and terminal G1 using resistance R1 and between node X1 and terminal G2 using resistance T2 can help filter out temporarily SEU disturbances.

The example of FIG. 3 in which cell 20 includes both resistances R1 and R2 is merely illustrative. In another suitable arrangement, memory cell 20 might only include resistance R1 but not resistance R2. In yet another suitable arrangement, memory cell 20 may only include resistance R2 but not resistance R1. If desired, additional parasitic resistances can also be added at the output of inverting circuits Inv1 and/or Inv2 to help with SEU mitigation.

Forming discrete resistors within a RAM cell might incur unacceptable area penalty and might also not be compatible with existing CMOS processing technology. In accordance with at least some embodiments, resistances R1/R2 may be implemented using parasitic resistances associated with gate conductors of transistors within memory cell 20 and also outside memory cell 20 (see, e.g., FIG. 4). Circuitry in FIG. 4 having similar structure as FIG. 3 are labeled with the same references and need not be described again.

Figure 4:
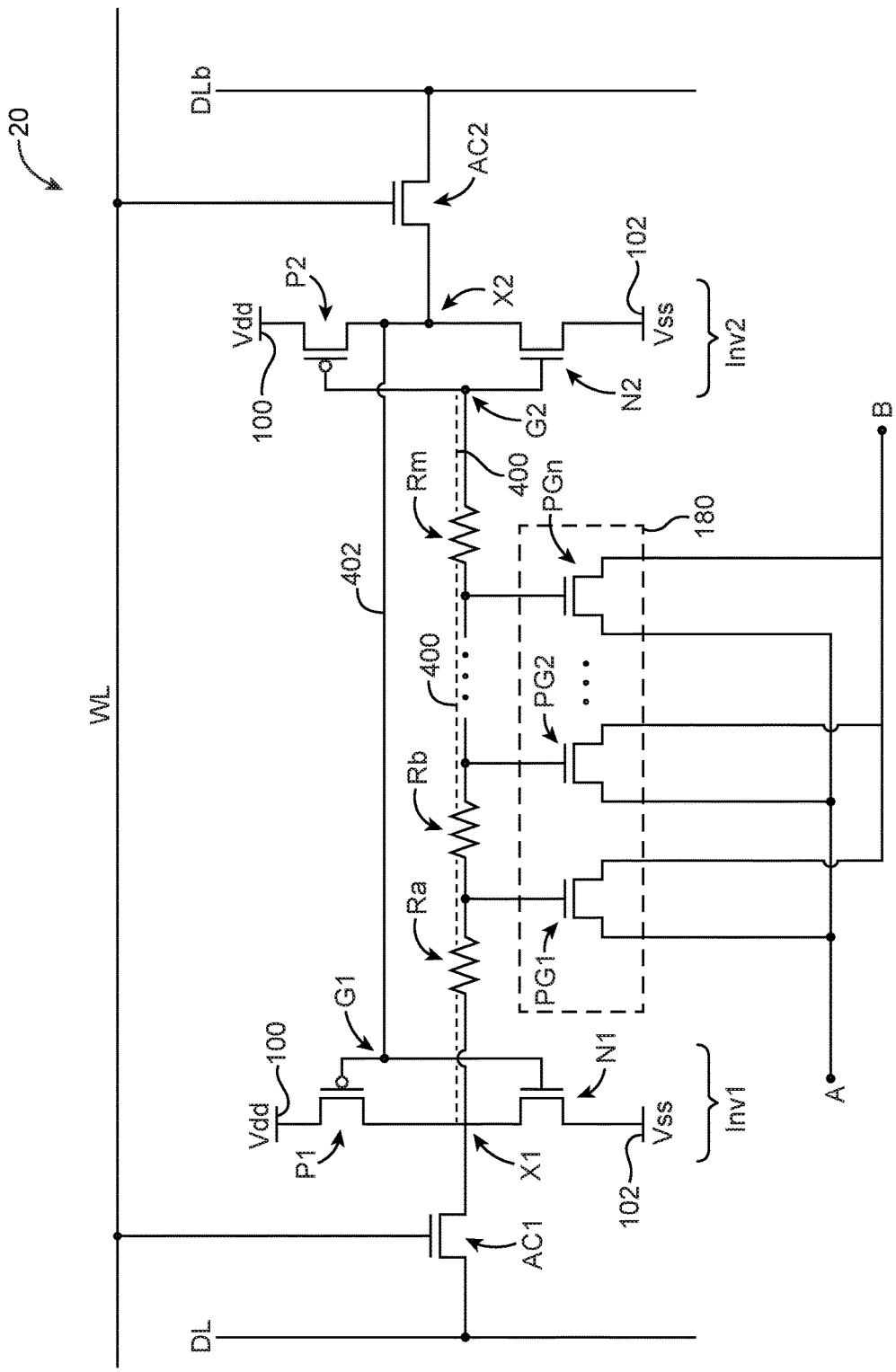
FIG. 4 is a diagram of an illustrative memory cell that includes a long gate conductor in accordance with an embodiment.

As shown in FIG. 4, inverting circuit Inv1 may include n-channel transistor N1 and p-channel transistor P1 coupled in series between a positive power supply line 100 (e.g., a power supply line on which positive power supply voltage Vdd is provided) and a ground power supply line 102 (e.g., a power supply line on which ground power supply voltage Vss is provided). In particular, transistor N1 may have a first source-drain terminal that is coupled to first data storage node X1, a second source-drain terminal that is coupled to ground power supply line 102, and a gate terminal that is shorted to the input G1 of circuit Inv1. Transistor P1 may have a first source-drain terminal that is coupled to first data storage node X1, a second source-drain terminal that is coupled to positive power supply line 100, and a gate terminal that is shorted to input G1 of circuit Inv1.

Similarly, circuit Inv2 may include n-channel transistor N2 and p-channel transistor P2 coupled in series between power supply lines 100 and 102. In particular, transistor N2 may have a first source-drain terminal that is coupled to second data storage node X2, a second source-drain terminal that is coupled to ground power supply line 102, and a gate terminal that is shorted to the input G2 of circuit Inv2. Transistor P2 may have a first source-drain terminal that is coupled to second data storage node X2, a second source-drain terminal that is coupled to positive power supply line 100, and a gate terminal that is shorted to input G2 of circuit Inv2.

In accordance with an embodiment, additional parasitic resistances Ra, Rb, . . . , and Rm may be interposed in path 400 between internal storage node X1 and gate terminal G2. In the example of FIG. 4, resistances such as Ra, Rb, and Rm may be implemented using the gate conductors of one or more programmable routing pass transistors 180 that are controlled by memory element 20. Pass transistor 180 may (as an example) be part of a routing multiplexer for routing active user signals from a first logic region to a second logic region on the integrated circuit, part of a programmable switch in a lookup table, or part of other configurable logic circuitry on the integrated circuit.

As shown in FIG. 4, transistor circuit 180 may be implemented as a multi-finger n-channel pass gate structure (e.g., transistor 180 may include multiple n-channel finger portions PG1, PG2, . . . , and PGn coupled in parallel). The multiple finger portions PG1-PGn may be coupled in parallel between terminal A (e.g., a first terminal that is coupled to a first/source logic region) and terminal B (e.g., a second terminal that is coupled to a second/destination logic region). If desired, the different transistor portions in circuit 180 need not be coupled in parallel. By leveraging the parasitic resistance of the existing pass transistor gate structures, SEU mitigation is provided without any area penalty. Moreover, the performance of the routing pass transistor circuit 180 is also improved since the effective resistance seen by each finger portion is reduced, thereby reducing any parasitic coupling effects between the user signal and the memory cell static voltage control.

In the exemplary arrangement of FIG. 4, path 402 connecting terminal G1 to data storage node X2 is not shown to include any pass transistor gate conductor. If desired, additional parasitic resistances may also be interposed in path 402 to help with SEU mitigation. In one suitable arrangement, the parasitic resistances may be implemented using gate conductors of routing pass gate transistor circuits. In another suitable arrangement, the parasitic resistances may be implemented using just the gate conductors of transistors N2 and P2 (e.g., by substantially increasing the length of gate conductor G2).

Figure 5:
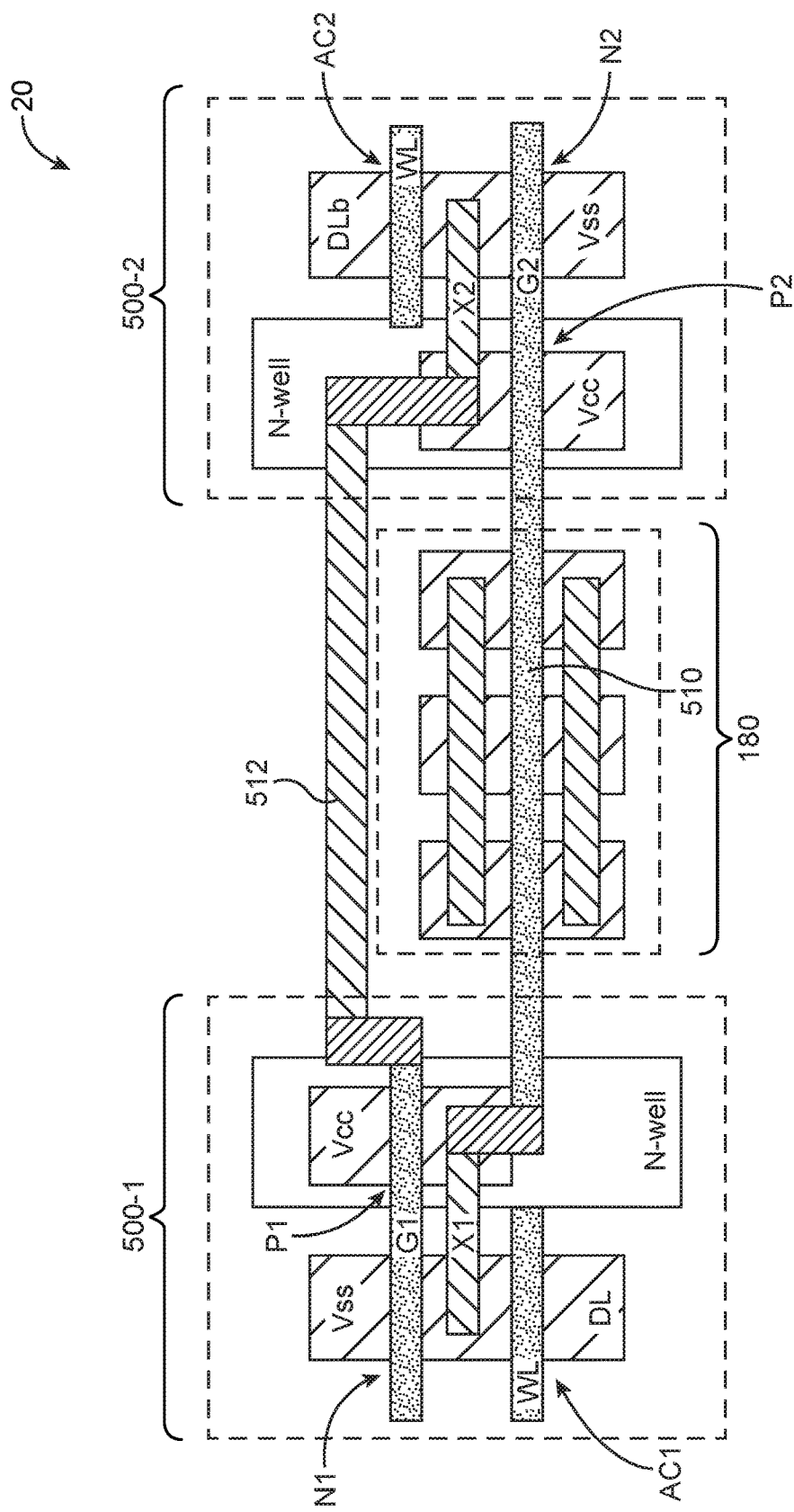
FIG. 5 is a top layout view showing how the memory cell shown in FIG. 4 can be divided into two portions in accordance with an embodiment.

FIG. 5 is a top layout view showing how memory cell 20 can be divided into two portions. As shown in FIG. 5, memory cell 20 may be separated into a first portion 500-1 and a second portion 500-2. First portion 500-1 may include transistors AC1, N1, and P1. Transistor P1 may be formed in a first n-well. Second portion 500-2 may include transistors AC2, N2, and P2. Transistor P2 may be formed in a second n-well. In particular, pass transistor circuit 180 may be interposed between portion 500-1 and portion 500-2 (e.g., circuit 180 may be physically and electrically coupled between the two half-cell portions). Gate conductor 510 may be long and may extend from portion 500-1 through circuit 180 to portion 500-2 (e.g., mirroring path 400 in FIG. 4). Metal path 512 (e.g., mirroring path 402 in FIG. 4) may also couple portion 500-1 to portion 500-2 by connecting terminal G1 to node X2. While path 510 is a gate conductor, path 512 may be formed in a first metal routing layer M1 that is above the gate conductor in a dielectric stack. If desired, path 512 may also be formed using gate conductive material to help increase resistance within the latch feedback path.

Figure 9:
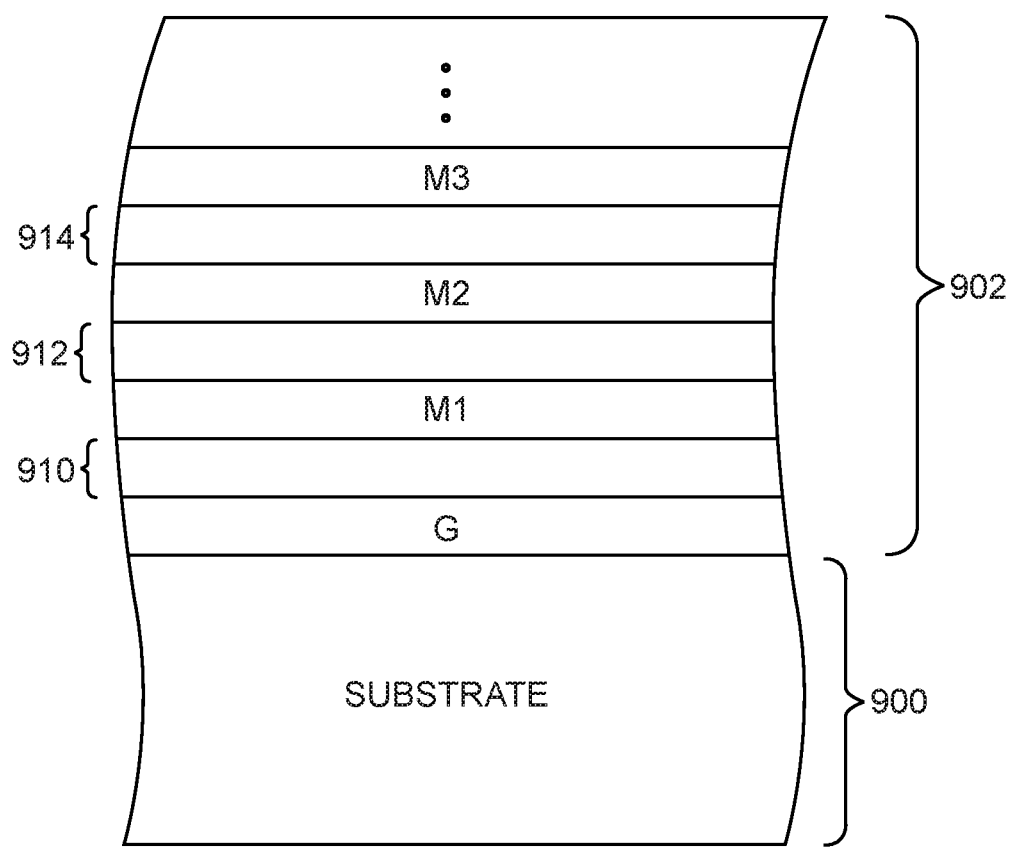
FIG. 9 is a cross-sectional side view of a dielectric stack formed on a semiconductor substrate in accordance with an embodiment.

FIG. 9 is a cross-sectional side view showing the different layers in a dielectric stack (sometimes referred to as an interconnect stack). As shown in FIG. 9, a dielectric stack such as dielectric stack 902 may be formed on a semiconductor substrate 900 (e.g., a p-type silicon substrate). Dielectric stack 902 may include alternating conductive routing layers and via layers.

Dielectric stack 902 may include a gate (G) routing layer (e.g., a gate layer in which transistor gate conductors are formed). A first metal routing layer M1 may be formed above the gate layer. A second metal routing layer M2 may be formed above the M1 layer. A third metal routing layer M3 may be formed above the M2 layer, and so on. A first via layer 910 may be interposed between the gate layer and the M1 layer. Conductive vias or "contacts" may be formed in layer 910 for connecting gate conductors in the gate layer to routing paths in the M1 layer. A second via layer 912 may be interposed between the M1 and M2 layers. Conductive vias may be formed in layer 912 for connecting routing paths in the M1 layer to routing paths in the M2 layer. Similarly, a third via layer 914 may be interposed between the M2 and M3 layers. Conductive vias may be formed in layer 914 for connecting routing paths in the M2 layer to routing paths in the M3 layer. In general, an integrated circuit may include any number of metal routing layers (e.g., at least five metal routing layers, at least eight metal routing layers, at least 10 metal routing layers, etc.).

Referring back to the example of FIG. 5, gate conductor 510 in the gate layer may be formed using polysilicon material. If desired, gate conductor 510 may also be formed using other conductive gate material (e.g., metal), doped conductive material, or may be formed/configured in other ways (e.g., by adjusting its total length and width) to provide the optimal amount of resistance. The optimal amount of resistance may depend on the required RC delay in the feedback loop. As an example, if the desired RC delay is at least half of 200 ps (picoseconds) and the total amount of parasitic capacitance at node G2 is equal to around 5 fF (femto-farads), then the parasitic (or intrinsic) resistance of path 510 should be at least 20 kΩ (kilo-ohms).

Figure 6:
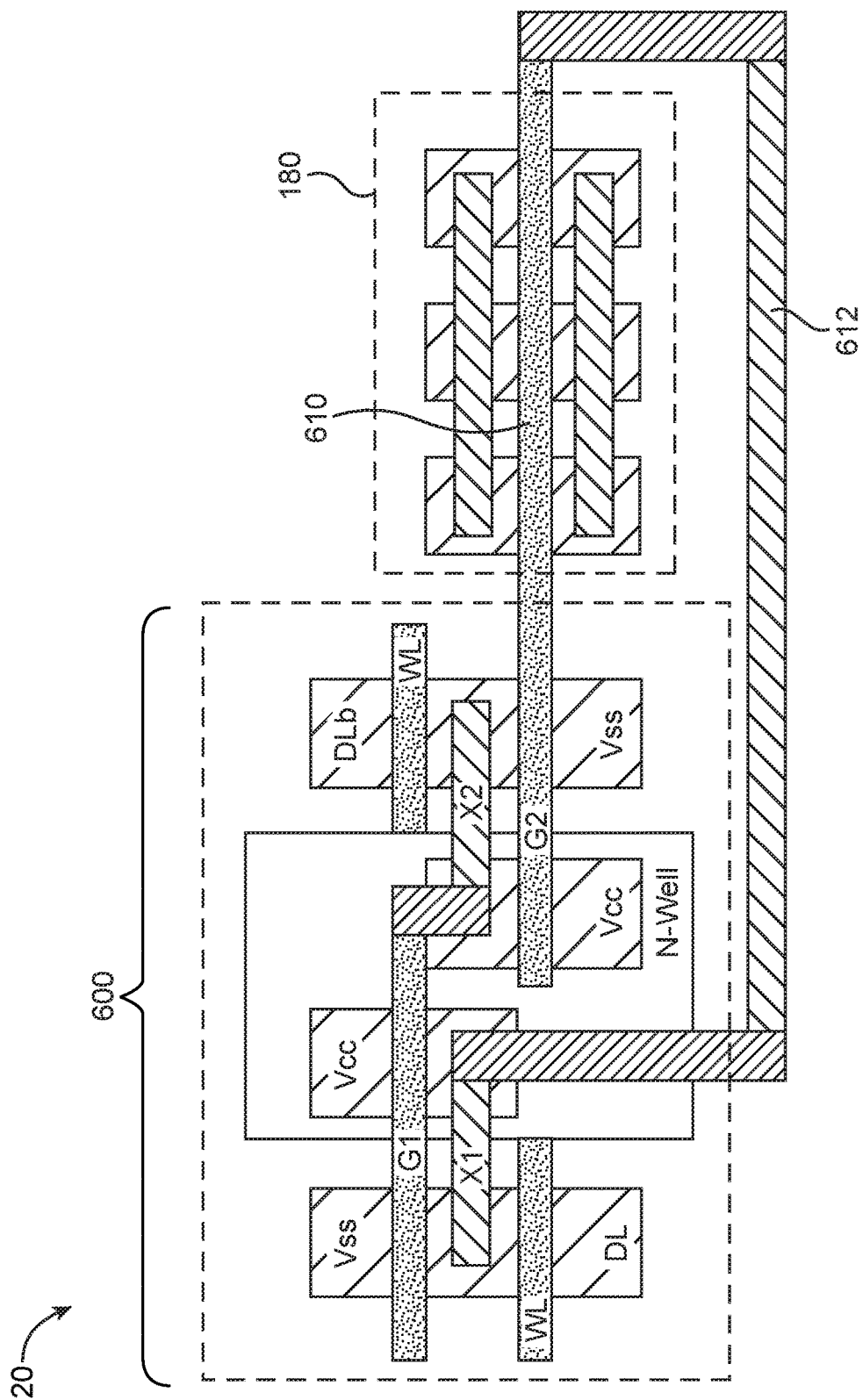
FIG. 6 is a top layout view showing how the memory cell shown in FIG. 4 can be grouped into one contiguous region in accordance with an embodiment.

FIG. 6 is a top layout view showing how memory element 20 can be grouped into one contiguous region. As shown in FIG. 6, memory cell 20 is formed entirely within region 600 (i.e., all of the transistors within cell 20 is formed inside region 600). Pass transistor circuit 180 may be formed adjacent to region 600. Gate conductor 610 may be long and may extend beyond region 600 through circuit 180. (e.g., mirroring path 400 in FIG. 4).

Metal path 612 may be configured to couple the extended G2 terminal back to internal data storage node X1. While path 610 is a gate conductor, path 612 may be formed in a first metal routing layer M1 that is above the gate conductor in a dielectric stack. If desired, path 612 may also be formed using gate conductive material to help increase the parasitic resistance within the latch feedback path.

Figure 7:
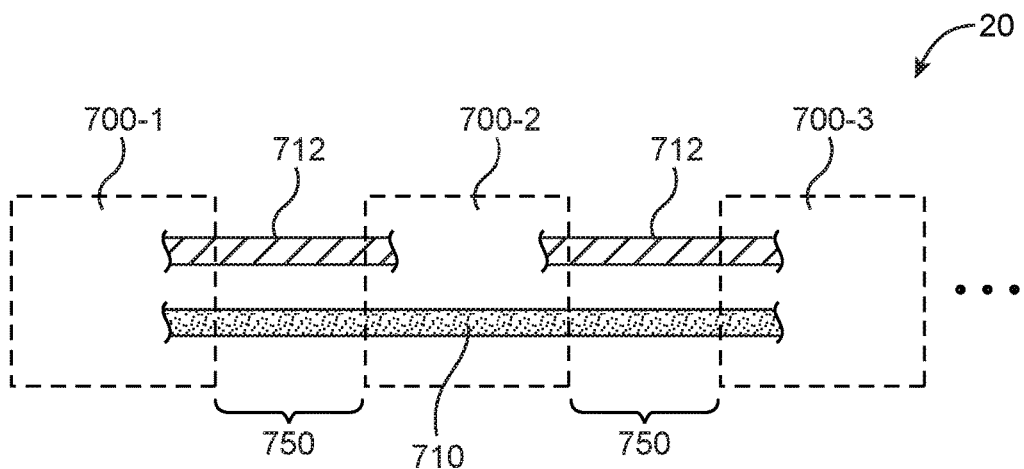
FIG. 7 is a diagram showing how the memory cell shown in FIG. 4 can be divided into more than two separate portions in accordance with an embodiment.

FIG. 7 is a diagram showing how memory element 20 can be divided into more than two separate portions. As shown in FIG. 7, memory element 20 may be separated into at least a first portion 700-1, a second portion 700-2, and a third portion 700-3. As an example, first portion 700-1 may include transistors AC1 and N1, second portion 700-2 may include transistors P1 and P2 formed in a shared n-well, and third portion 700-3 may include transistors AC2 and N2. This is merely illustrative. If desired, the transistors within memory element 20 (which may include more than or less than six transistors) may be distributed among the multiple portions in other suitable ways.

Gate conductor 710 may be long and may extend at least partially through portions 700-1, 700-2, and 700-3. Gate conductor 710 configured in this way can serve to provide the parasitic SEU mitigation resistance. Additional conductive paths 712 (e.g., conductors formed in the gate layer or higher M1/M2 metal routing layers) can help couple together the different portions 700. Additional transistor structures that are not explicitly part of memory element 20 such as pass transistor circuits 180 or other associated programmable/memory circuitry may be formed in regions 750 interposed between adjacent portions 700.

Figure 8:
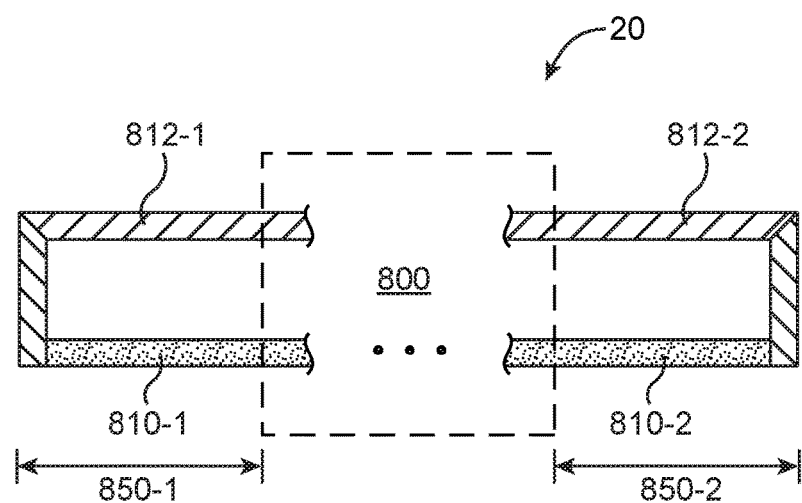
FIG. 8 is a diagram showing how the memory cell shown in FIG. 4 can have the gate conductor extend well beyond its borders in accordance with an embodiment.

FIG. 8 is a diagram showing how memory element 20 can have a gate conductor that extends well beyond its borders.

As shown in FIG. 8, memory cell 20 is formed entirely within region 800 (i.e., all of the transistors within cell 20 is formed inside region 800). In particular, gate conductor 810-1 may protrude from region 800 from a first side and gate conductor 810-2 may protrude from region 800 from a second side.

Metal path 812-1 may be configured to couple the extended gate conductor 810-1 back to some node within memory cell 20, whereas metal path 812-2 may be configured to couple the extended gate conductor 810-2 back to some node within memory cell 20. While paths 810-1 and 810-2 are formed in the gate layer, paths 812-1 and 812-2 may be formed in a first metal routing layer M1 that is above the gate conductor in a dielectric stack (see, e.g., FIG. 9). If desired, paths 812-1 and 812-2 may also be formed using gate conductive material in the gate layer to help increase the parasitic resistance within the latch feedback path. Additional transistor structures that are not explicitly part of memory element 20 such as pass transistor circuits 180 or other associated programmable/memory circuitry may be formed in regions 850-1 and 850-1 overlapping with extended/protruding paths 810 and 812.

The example of FIG. 8 in which two gate conductors extends outside of the memory cell region is merely illustrative. If desired, gate conductors may protrude from within the memory cell boundary from at least three points or sides or from at least four points or sides to help provide increased SEU mitigation resistance.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit comprising: a first inverting circuit; a second inverting circuit coupled to the first inverting circuit via a path; and a configurable circuit having a gate conductor that provides parasitic resistance in the path between the first inverting circuit and the second inverting circuit, the parasitic resistance provides soft error upset (SEU) mitigation for the first and second inverting circuits.

Example 2 is the integrated circuit of Example 1, wherein the first inverting circuit has a first input and a first output, the second inverting circuit has a second input and a second output, the first input is optionally coupled to the second output, and the second input is optionally coupled to the first output.

Example 3 is the integrated circuit of Example 1, optionally further comprising an access transistor coupled to the first and second inverting circuits, the access transistor receives a word line signal.

Example 4 is the integrated circuit of any one of Examples 1-3, wherein the first and second inverting circuits optionally output a static control signal to the configurable circuit.

Example 5 is the integrated circuit of Example 4, wherein the configurable circuit is optionally a multi-finger pass gate structure.

Example 6 is the integrated circuit of Example 5, wherein the multi-finger pass gate structure optionally comprises a plurality of finger portions coupled in parallel.

Example 7 is the integrated circuit of any one of Examples 1-3 and 5-6, wherein the first inverting circuit is formed in a first region, the second inverting circuit is formed in a second region, the configurable circuit is formed in a third region that is optionally interposed between the first region and the second region, and the gate conductor optionally extends from the first region through the second region to the third region.

Example 8 is the integrated circuit of Example 7, optionally further comprising a conductive path coupling an input of the first inverting circuit to an output of the second inverting circuit.

Example 9 is the integrated circuit of any one of Examples 1-3 and 5-6, wherein the first and second inverting circuits are optionally formed in a contiguous region, the configurable circuit is formed in an adjacent region, and the gate conductor having a first end that is optionally coupled to the second inverting circuit and a second end that is optionally coupled to the first inverting circuit.

Example 10 is the integrated circuit of Example 9, optionally further comprising a conductive path coupling the second end of the gate conductor to an output of the first inverting circuit.

Example 11 is an integrated circuit comprising: a memory element having a first inverting circuit formed in a first region and a second inverting circuit formed in a second region; and a configurable circuit that receives a static control signal from the memory element, the configurable circuit having a gate conductor having a first end that extends into the first region and a second end that extends into the second region.

Example 12 is the integrated circuit of Example 11, wherein the configurable circuit is optionally interposed between the first region and the second region.

Example 13 is the integrated circuit of any one of Examples 11-12, optionally further comprising a conductive path coupling an input of the first inverting circuit to an output of the second inverting circuit.

Example 14 is the integrated circuit of Example 13, wherein the gate conductor and the conductive path are optionally formed in different layers in a dielectric stack.

Example 15 is the integrated circuit of Example 13, wherein the gate conductor and the conductive path are optionally formed in the same layer in a dielectric stack.

Example 16 is an integrated circuit comprising: a memory element having a boundary and a gate conductor, the gate conductor having an end that protrudes from the boundary of the memory element; and a conductive path having a first terminal that is coupled to the protruding end of the gate conductor and a second terminal that extends within the boundary of the memory element.

Example 17 is the integrated circuit of Example 16, wherein the memory element optionally comprises a first inverting circuit and a second inverting circuit, wherein the first terminal of the conductive path is optionally coupled to an output of the first inverting circuit, wherein the second terminal of the conductive path is optionally coupled to an input of the second inverting circuit, and wherein the gate conductor optionally also serves the input of the second inverting circuit.

Example 18 is the integrated circuit of any one of Examples 16-17, wherein the gate conductor and the conductive path are optionally formed in different layers in a dielectric stack.

Example 19 is the integrated circuit of any one of Examples 16-17, wherein the gate conductor and the conductive path are optionally formed in the same layer in a dielectric stack.

Example 20 is the integrated circuit of any one of Examples 16-17, wherein all transistors of the memory element are optionally formed within the boundary.

For instance, all optional features of the apparatus described above may also be implemented with respect to any method or process described herein. The foregoing is merely illustrative of the principles of this disclosure and various modifications can be made by those skilled in the art.

What is claimed is:

1. An integrated circuit comprising:
   a first inverting circuit;
   a second inverting circuit coupled to the first inverting circuit via a path, wherein the first inverting circuit has a first input and a first output, the second inverting circuit has a second input and a second output, the first input is coupled to the second output, and the second input is coupled to the first output; and
   a configurable circuit having a gate conductor that provides parasitic resistance in the path between the first inverting circuit and the second inverting circuit, the parasitic resistance provides soft error upset (SEU) mitigation for the first and second inverting circuits.

2. The integrated circuit of claim 1, wherein the gate conductor of the configurable circuit has a first end connected to the first output of the first inverting circuit and a second end connected to the second input of the second inverting circuit.

3. The integrated circuit of claim 1, further comprising an access transistor coupled to the first and second inverting circuits, the access transistor receives a word line signal.

4. The integrated circuit of claim 1, wherein the first and second inverting circuits output a static control signal to the configurable circuit.

5. The integrated circuit of claim 4, wherein the configurable circuit is a multi-finger pass gate structure.

6. The integrated circuit of claim 5, wherein the multi-finger pass gate structure comprises a plurality of finger portions coupled in parallel.

7. The integrated circuit of claim 1, wherein the first inverting circuit is formed in a first region, the second inverting circuit is formed in a second region, the configurable circuit is formed in a third region that is interposed between the first region and the second region, and the gate conductor extends from the first region through the second region to the third region.

8. The integrated circuit of claim 7, further comprising a conductive path coupling an input of the first inverting circuit to an output of the second inverting circuit.

9. The integrated circuit of claim 1, wherein the first and second inverting circuits are formed in a contiguous region, the configurable circuit is formed in an adjacent region, and the gate conductor having a first end that is coupled to the second inverting circuit and a second end that is coupled to the first inverting circuit.

10. The integrated circuit of claim 9, further comprising a conductive path coupling the second end of the gate conductor to an output of the first inverting circuit.

11. An integrated circuit comprising:
    a memory cell having a first inverting circuit formed in a first region and a second inverting circuit formed in a second region, wherein the first inverting circuit is cross-coupled with the second inverting circuit; and
    a configurable circuit that receives a static control signal from the memory cell, the configurable circuit having a gate conductor having a first end that extends into the first region and a second end that extends into the second region.

12. The integrated circuit of claim 11, wherein the configurable circuit is physically interposed between the first region and the second region, and wherein the gate conductor extends along a straight line from the first region to the second region.

13. The integrated circuit of claim 11, further comprising a conductive path coupling an input of the first inverting circuit to an output of the second inverting circuit, wherein the gate conductor couples an output of the first inverting circuit to an input of the second inverting circuit, and wherein the gate conductor and the conductive path extend parallel to each other.

14. The integrated circuit of claim 13, wherein the gate conductor and the conductive path are formed in different layers in a dielectric stack.

15. The integrated circuit of claim 13, wherein the gate conductor and the conductive path are formed in the same layer in a dielectric stack.

16. An integrated circuit comprising:
    a memory cell having a boundary and a gate conductor, wherein the memory cell comprises cross-coupled inverting circuits, and wherein the gate conductor has an end that protrudes from the boundary of the memory cell; and
    a conductive path having a first terminal that is coupled to the protruding end of the gate conductor and a second terminal that extends within the boundary of the memory cell.

17. The integrated circuit of claim 16, wherein the first terminal of the conductive path is coupled to an output of the first inverting circuit, wherein the second terminal of the conductive path is coupled to an input of the second inverting circuit, and wherein the gate conductor also serves the input of the second inverting circuit.

18. The integrated circuit of claim 16, wherein the gate conductor and the conductive path are formed in different layers in a dielectric stack.

19. The integrated circuit of claim 16, wherein the gate conductor and the conductive path are formed in the same layer in a dielectric stack.

20. The integrated circuit of claim 16, wherein all transistors of the memory cell are formed within the boundary.

\* \* \* \* \*